United States Patent [19]

Chang et al.

[11] 4,103,312

[45] Jul. 25, 1978

[54] SEMICONDUCTOR MEMORY DEVICES

[75] Inventors: Leroy Ligong Chang, Mohegan Lake; Leo Esaki, Chappaqua; George Anthony Sai-Halasz, Mohegan Lake, all of N.Y.

[73] Assignee: International Business Machines Corporation, Armonk, N.Y.

[21] Appl. No.: 805,068

[22] Filed: Jun. 9, 1977

[51] Int. Cl.² .......................................... H01L 29/161
[52] U.S. Cl. .......................................... 357/16; 357/3; 357/4; 357/88; 357/30; 307/238; 365/114; 365/215
[58] Field of Search .................... 357/16, 88, 30, 4, 3; 307/238; 365/114, 215, 174

[56] References Cited

U.S. PATENT DOCUMENTS

| 3,626,257 | 12/1971 | Esaki | 317/234 R |
| 3,626,328 | 12/1971 | Easki | 331/107 G |
| 3,721,583 | 3/1973 | Blakeslee | 107/215 |
| 3,872,400 | 7/1972 | Glauseher | 331/94.5 M |
| 3,882,533 | 5/1975 | Dohler | 357/58 |
| 3,893,148 | 7/1975 | Madjid | 357/16 |
| 3,929,527 | 12/1975 | Chang | 148/175 |

OTHER PUBLICATIONS

Esaki et al, Thin Solid Films, 36 (1976) pp. 289-298.
Chang et al, J. Voc. Sci. Technol., vol. 10, No. 1, Jan.-/Feb. 1973, pp. 11-16.
Chang et al, J. Voc. Sci. Technol. vol. 10, No. 5, Sep.-/Oct. 1973, pp. 655-662.
Blakeslee, I.B.M. Tech. Discl. Bull., vol. 14, No. 2, Jul. 1971, pp. 539-541.

Primary Examiner—Martin H. Edlow
Attorney, Agent, or Firm—Jackson E. Stanland

[57] ABSTRACT

A semiconductor memory (storage) device is provided using layered semiconductor structures which produce spatially separate electron and hole wells. The state of the device depends upon whether or not charge carriers (electrons and holes) are confined in these wells. Thus, the device has a first state exhibiting one conductance or capacitance when the wells do not have charge carriers in them, and a second state (different conductance or capacitance) when charge carriers are confined in the potential wells. The lifetime of the state in which carriers are confined in the wells depends upon the amount of time required for electron-hole recombination and is expected to be very long since the electrons and holes are spatially separated. A preferred embodiment utilizes a layered heterostructure formed in the space charge region of a p-n junction. Electrons and holes are generated in the potential wells using either electrical injection or incident light, while reading is accomplished by measuring conductance or capacitance. Erasure of the device state is achieved by a reverse electrical bias which removes the electrons and holes from confinement in the potential wells. Confinement of electrons and holes in three dimensions is also achieved.

50 Claims, 25 Drawing Figures

FIG. 4A STATE 1

FIG. 4B STATE 2

FIG. 5A (WRITE)

FIG. 5B (ERASE)

FIG. 6

FIG. 7A STATE 1

FIG. 7B STATE 2

FIG. 8

FIG. 9A
(STATE 1)

FIG. 9B
(STATE 2)

FIG. 11D WIDE GAP

SEMICONDUCTOR MEMORY DEVICES

The invention was made under a Government Contract with the Department of Defense, Army Research Office.

BACKGROUND OF THE INVENTION

1. Field of the Invention

This invention relates to semiconductor storage devices, and more particularly to an improved semiconductor storage device using alternating layers of different semiconductor materials to provide spatially separate potential wells for confinement of holes and electrons, where the state of the device depends upon whether or not electrons and holes are confined in these wells.

2. Description of the Prior Art

Many types of semiconductor memories are known in the art, including those using bipolar type transistors or field effect transistors in shift register circuits. Typically, these are active devices where the state of the device or circuit is continually refreshed during operation since it is basically a volatile type of storage.

Various photoconductor memories are also known in the art which generally involve deep traps for retention of electrons. These photoconductors are light activated and often shown degradation properties which are adverse to their successful use.

In contrast with these prior art semiconductor memories and photoconductors, the present invention seeks to provide controllable semiconductor memory devices in which electrical activation, or light activation, can be used for writing in the state of the device. Conduction band edge discontinuities and valence band edge discontinuities are used to provide confinement wells for holes and electrons, in contrast with prior art photoconductors where deep traps, due to impurities, etc., are used for retention of charge carriers.

Accordingly, it is a primary object of the present invention to provide a semiconductor memory device in which storage states can be maintained for long lifetimes.

It is another object of the present invention to provide semiconductor storage devices which are more efficient than prior semiconductor memory devices or photoconductors.

It is another object of the present invention to provide a semiconductor storage device in which the storage states of the device exist at zero bias, i.e., without retention voltages or power.

It is another object of the present invention to provide a semiconductor photoconductive material which does not require deep traps for retention of charge carriers.

It it another object of the present invention to provide a semiconductor photoconductor which does not require the use of impurity dopants for provision of charge trapping centers.

It is still another object of the present invention to provide a semiconductor storage device which is responsive to electrical or light activation having controlled valence band and conduction band edge discontinuities.

It is yet another object of the present invention to provide a semiconductor storage device in which charge carriers can be controllably retained for long periods of time.

It is a further object of the present invention to provide an improved semiconductor storage device having long lifetime, which can be electrically addressed for write, read, and erase operations.

It is a further object of the present invention to provide arrays of semiconductor storage devices providing three-dimensional confinement of electrons and holes in the devices.

BRIEF SUMMARY OF THE INVENTION

This semiconductor storage device has two electrically discernible states depending upon the presence or absence of electrons and holes in potential wells in the device. A preferred embodiment utilizes a heterostructure comprising alternating layers of two different semiconductor materials to form a periodic structure. This structure provides conduction band edge discontinuities $\Delta E_c$ and valence band edge discontinuities $\Delta E_v$, which are in the same direction. The energy band diagram of the device comprises a series of spatially separate electron and hole wells. This helps to prevent electrons and holes which are confined in these wells from readily recombining. Thus, one state of the device is that where electrons and holes are confined in the potential wells, while another state of the device is that in which electrons and holes are not confined in these potential wells. Both states exist at zero bias, i.e., retention voltaes or power are not required.

in a preferred embodiment, the heterostructure comprising alernating layers of different semiconductor materials is located between a p-type semiconductor layer and an n-type semiconductor layer. Therefore, the electron and hole potential wells are produced in the space charge region of the p-n junction formed by the p-type and n-type layers. This is a particularly advantageous embodiment, since, when electrons and holes are not confined in the potential wells, the device exhibits relatively high resistivity at small voltages and will undergo a large change in conductance when charge carriers are confined in these wells.

Electrical means or light means can be used to generate excess charge carriers in the device for confinement in the potential wells. When electrical means are used, the storage device is forward biased to inject electrons and holes. When light is used, an incident light beam with energy greater than the energy gaps of the semiconductors will generate excess electrons and holes which with fall into and become confined in the potential wells in the space charge region of the p-n junction. This constitutes the WRITE operation.

The state of the device is read by measuring the conductance or capacitance of the device at or near zero bias voltages. The capacitance or conductance is a measure of whether or not electrons and holes are trapped in the potential wells. Conventional equipment can be used for these measurements, including a voltage source and a current meter, or a capacitance bridge.

Erasure is obtained by removing the confined electrons and holes from their potential wells. This can be achieved by applying a large reverse bias across the device. This will give the electrons and holes sufficient energy to escape from their respective wells so that they can more readily recombine.

In the practice of this invention, multilayer structures of high quality semiconductors can be provided in a controlled manner to produce a periodic sequence of potential discontinuities $\Delta E_c$ and $\Delta E_v$ in the conduction band edge and valence band edge, respectively. These discontinuities are in the same direction in the energy diagram of the storage device, and insure that the potential wells for electrons are spatially separated from the potential wells for holes.

Other embodiments which can be used in the practice of the present invention include a heterostructure of alternating layers of different semiconductor materials, where the heterostructure is not located between the p-type semiconductor layer and an n-type semiconductor layer. Thus, this embodiment is similar to the preferred embodiment except that the space charge region of a p-n junction is not provided.

Stiall another embodiment is one in which the same type of semiconductor material is used throughout the device, except that alternating layers of different conductivity type are used. For instance, a structure comprising alternating layers of opposite conductivity type can be fabricated by controlled impurity profiles during deposition by molecurlar beam epitaxy (MBE). As an example, a plurality of layers of opposite conductivity type p-n-p-n- . . . can be formed in either Si or Ge. The indirect energy gaps in these materials will, in general, help to obtain a long lifetime for excess minority carriers.

Another embodiment utilizes a superlattice structure comprising many ultrathin layers, where the thickness of each layer is sufficiently smaller than the electron means free path in the layer. In this superlattice structure, quantized energy states will result. Semiconductor alloys of the type used to make the preferred embodiment can also be used to provide the superlattice of this embodiment. The operation of this superlattice embodiment is essentially the same as that as that described previously. The only difference is that quantized states rather than the band edges are used as confinement wells for electrons and holes.

In the practice of this invention, alternating layers of semiconductor alloys of InGaAs and GaSbAs are particularly suitable for providing good quality heterostructures. Further, alternating layers of Si and GaP are also suitable since they will provide the necessary band structure and the required lattice matching.

These and other objects, features, and advantages will be more apparent from the following more particular description of the preferred embodiments.

BRIEF DESCRIPTION OF THE DRAWINGS

FIGS. 7A and 7B are energy band diagrams for the device of FIG. 6, where FIG. 7A illustrates one storage of the device while FIG. 7B illustrates another storage state of the device.

FIGS. 9A and 9B illustrate energy bnd diagrams for the storage device of FIG. 8, where FIG. 9A illustrates one storage state of the device, while FIG. 9B illustrates another storage state.

DETAILED DESCRIPTION OF THE PREFERRED EMBODIMENTS

Figure 1A:
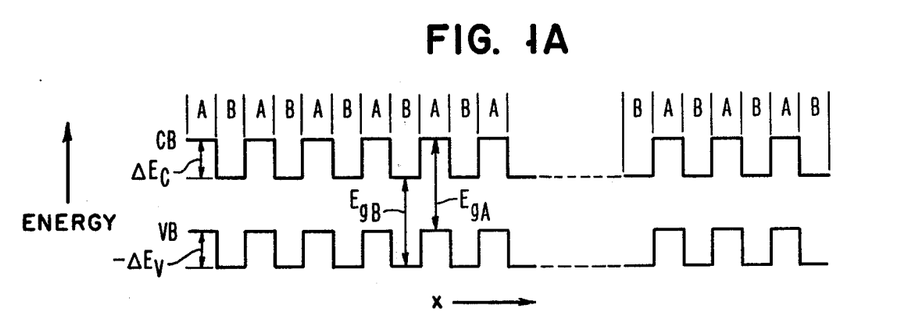
FIG. 1A illustrates an energy band diagram suitable for providing a storage device in accordance with the principles of the present invention, where separated electron and hole wells are provided.
Figure 1B:
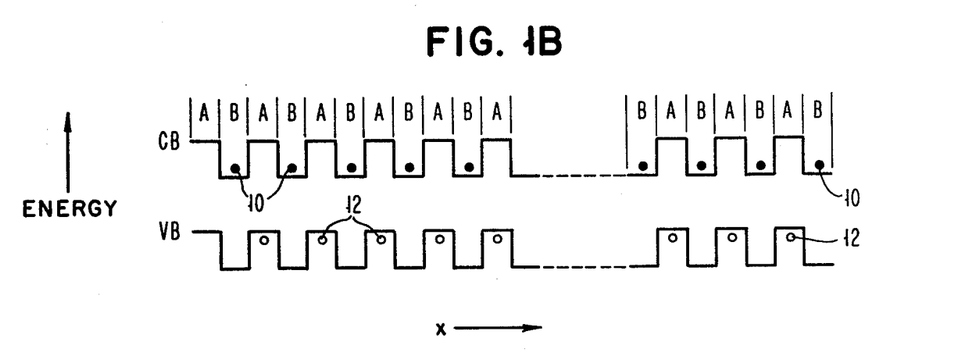
FIG. 1B is the energy band diagram of FIG. 1A, showing the presence of confined electrons and holes which are spatially separated along the x-direction.
Figure 2:
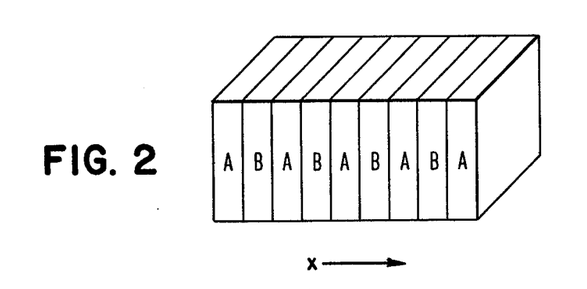
FIG. 2 is a schematic representation of a layered heterostructure comprising alternating layers of the semiconductors A and B, which will have an energy band diagram such as that in FIG. 1A.

THEORY (FIGS. 1A, 1B and 2)

This invention relies upon the use of layered structures of different semiconductor materials to produce spatially separated potential wells for holes and electrons. A preferred embodiment is one where the alternating layers have the same thickness and smooth interfaces therebetween, which will be a periodic structure. The structure has a first state when electrons and holes are not confined in the separated potential wells, and a second state when electrons and holes are confined in these wells. In particular, the storage device comprising the periodic structures of layered semiconductors has a first conductance or capacitance in a state where electrons and holes are not confined in the potential wells, and a second conductance or capacitance when electrons and holes are confined in these wells.

Since the potential wells for electrons are spatially separated from those for holes, the time for electron-hole recombination is relatively long. This lifetime could be from illiseconds to several seconds. Thus, the state in which electrons and holes are confined in the potential wells is refreshed periodically during device operation, if it is desired to maintain that state.

In order to write information into the storage device, excessive charge carriers are generated therein. This means that a number of carriers in excess of that established by thermal equilibrium is generated in the device. Generation of electrons and holes can be achieved either by electrical means wherein holes and electrons are injected into the device by a relatively large forward bias, or by incident light radiation. In order to erase a state from the storage device, a large reverse electrical bias is applied to the device. This will remove confined electrons and holes from their wells so that they can readily recombine. Reading is accomplished by measuring either the electrical conductance of the device in a direction normal to the plane of the layers of the device, or by measuring the capacitance across the device in the same direction. Since the current through the device and the capacitance across the device will depend upon whether or not electrons and holes are confined in the potential wells, this will be a measure of the state of the device.

Referring more particularly now to FIG. 1A, an energy band diagram suitable for the practice of the present invention is illustrated. The diagram is one in which a plurality of conduction band edge discontinuities $\Delta E_c$ are produced as one goes from one semiconductor material A to the adjacent semiconductor material B, etc. Valence band edge discontinuities $\Delta E_v$ also exist between the adjacent different semiconductor materials A and B. Since the widths of the wells are the same in this diagram, the thicknesses of the semiconductor layers A and B are the same. Here, the energy gap between the conduction band CB and valence band VB of semiconductor A is designated $E_{gA}$ while the energy gap between CB and VB of semiconductor B is designated $E_{gB}$. FIG. 1A is used to illustrate one state of a layered semiconductor structure, while FIG. 1B illustrates a second state of this structure.

In more detail, FIG. 1B shows the same energy diagram, except that electrons and holes are confined in separated wells to provide a second storage state. The electrons are illustrated by the darkened circles 10, while the holes are illustrated by the open circles 12. As will be noted, the confined electrons and holes are separated from one another in the direction x normal to the plane of the alternating semiconductor layers. Since the confined electrons and holes are spatially seprated from one another, the lifetime of the storage state indicated in FIG. 1B will be relatively long, because the confined holes and electrons cannot readily recombine with one another.

One particularly suitable structure for achieving the energy band diagram of FIG. 1A is a heterostructure comprising alternating layers of two different semiconductor materials A and B. Such a structure (where layers A and B have the same thickness) is shown in FIG. 2, which also indicates the direction x.

In the practice of this invention, semiconductors A and B are readily provided using semiconducting alloys. One example of material A is the semiconductor alloy $GaSb_{1-y}As_y$, while an example of semiconductor B is $In_{1-x}Ga_xAs$. These semiconductor alloys can be readily latice matched and their energy diagrams yield the proper band edge discontinuities $\Delta E_c$ and $\Delta E_v$. As noted, $\Delta E_c$ and $\Delta E_v$ are in the same direction in the energy band diagram of the device.

For the InGaAs-GaSbAs alloys mentioned, representative values of x and y are $x = y = 0.5$–$0.6$. *For these values of x and y, the lattice mismatch between adjacent semiconductor layers would be approximately zero.* For $x = y = 0.5$, $\Delta E_c \simeq \Delta E_v = 0.5$ eV. If $x = y = 0.6$, $\Delta E_c \simeq \Delta E_v = 0.4$ eV.

The thickness of the semiconductor layers A and B are not critical and can be for example, for approximately 10 Angstroms to 1000 Angstroms. A preferred thickness is of the order of several hundred Angstroms, 500 Angstroms being a suitable thickness. The conductivity level of the semiconducting layers A and B is low, for example $10^{16}$ cm$^{-3}$, or intrinsic.

In the practice of this invention, any semiconducting materials can be used for layers A and B, if they provide the proper energy band diagram and can be fabricated to provide a structure in which interface states are minimized. If the alternating semiconductor layers can be perfectly lattice matched, this will provide a prerequisite for elimination of interface states, which will insure long lifetimes of the storage device. Molecular beam epitaxy is particularly suitable for providing epitaxial layers in the heterostructure. As an example of another semiconductor system, semiconductor materials A and B can be Si and GaP.

If the interfaces between the semiconductors A and B are smooth, good devices will result. These interfaces need not be perfectly abrupt, since uniform compositional grading is also suitable. In this regard, such grading can be controlled or programmed during the deposition by MBE to provide, for example, sinusoidal or triangular wells in the energy band diagrams rather than the square (rectangular) wells in the diagram of FIG. 1A.

JUNCTION STORAGE DEVICE (FIGS. 3, 4A, 4B, 5A, and 5B)

Figure 3:
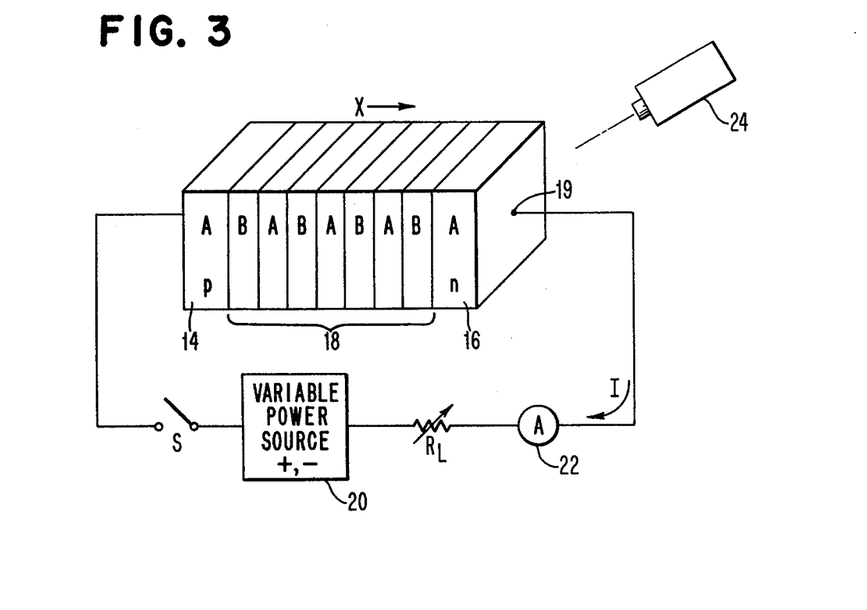
FIG. 3 is a storage device in accordance with the principles of the present invention, where a heterostructure is comprised of a plurality of alternating layers of two semiconductor materials located between a p-type semiconductor material A and an n-type semiconductor, also of material A.

This storage device is a heterostructure storage device in which the layers of the heterostructure are comprised of semiconductor materials A and B. The outer semiconductor layers 14 and 16 are of p and n-type conductivity, respectively. The heterostructure 18 is used to provide spatially separated electron and hole wells in the space charge region associated with the p-n junction comprising layers 14 and 16. In the device of FIG. 3, outer layers 14 and 16 are comprised of the same semiconductor material A. For the InGaAs-GaSbAs system described, semiconductor A would be GaSbAs semiconductor B would be InGaAs.

The thickness of the individual layers in heterostructure 18 are typically of the order of hundreds of Angstroms while the end layers 14 and 16 are thicker, and typically about 1000 Angstroms. This enables the easy provision of ohmic contracts 19 to the layers 14 and 16. The number of layers in heterostructure 18 is chosen so that the two states of the storage device are easily distinguished from one another. A representative number of layers in heterostructure 18 is 1–10 depending on the width of the space charge region and the thickness of each layer in the heterostructure 18. It is important that the potential wells be within the space charge region of the p-n junction formed by layers 14 and 16. The width of the space charge region is determined by the doping of layers 14 and 16. For doping of about $10^{16}$–$10^{17}$ cm$^{-3}$, this width may be 1000–3000 Å. Consequently, for heterolayers of about 500 Å thickness, 2-6 layers will be used. The doping levels of the layers in heterostructure 18 are typically low, or intrinsic.

Switch S, variable power source 20, load resistor $R_L$, and current meter 22 are connected in series to the storage device. Also, a light source 24 is provided. A variable power source is used to forward bias the p-n junction of the device or reverse bias this junction, and is also used when current I is to be measured for determining the state of the device. While meter 22 can be a current meter for indicating the conductance of the device, it could be replaced by a capacitance bridge if it is desired to determine the state of the device by measuring its capacitance. Light source 24 is used to provide an incident light beam for generating excess holes and electrons in the storage device for confinement in the potential wells of the device.

Figure 4A:
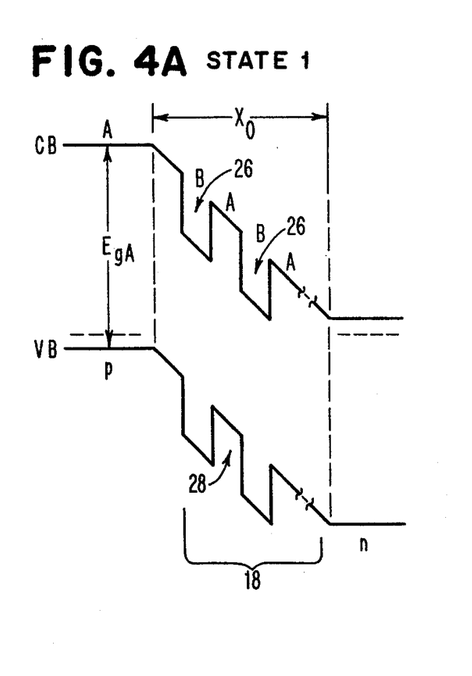
FIG. 4A is an energy band diagram of the device of FIG. 3, in an unbiased state, representing the storage state where electrons and holes are not confined in the separated potential wells.
Figure 4B:
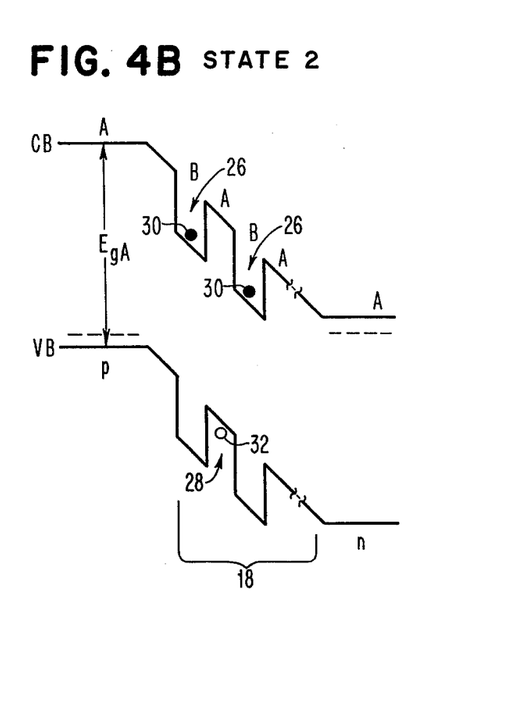
FIG. 4B is an energy band diagram of the storage device of FIG. 3, in an unbiased state, which illustrates the storage state of the device where electrons and holes are confined in separated potential wells.

FIGS. 4A and 4B illustrate the energy band diagram of the device of FIG. 3, where FIG. 4A indicates one state of the device while FIG. 4B illustrates nother state of the device. These energy band diagrams are for an unbiased device. The space charge region associated with the p-n junction has a width denoted $X_o$ and the heterostructure 18 provides potential wells within this space charge region. For ease of illustration, only a small number of the potential wells is shown.

In FIG. 4A, electron potential wells 26 are provided along the conduction band edge while hole potential wells 28 are provided along the valence band edge. In the first state of the storage device, electrons and holes are not confined in the wells 26 and 28, respectively.

In FIG. 4B, a second state of the storage device is illustrated. Here, confined electrons are illustrated by the darkened circles 30 while confined holes are illustrated by the open circles 32.

Figure 5A:
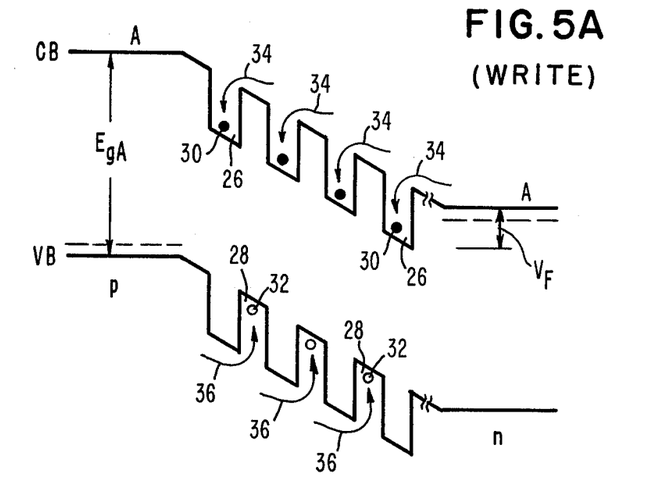
FIG. 5A illustrates the WRITE operation where electrons and holes enter and become confined in the potential wells of the storage device of FIG. 3.
Figure 5B:
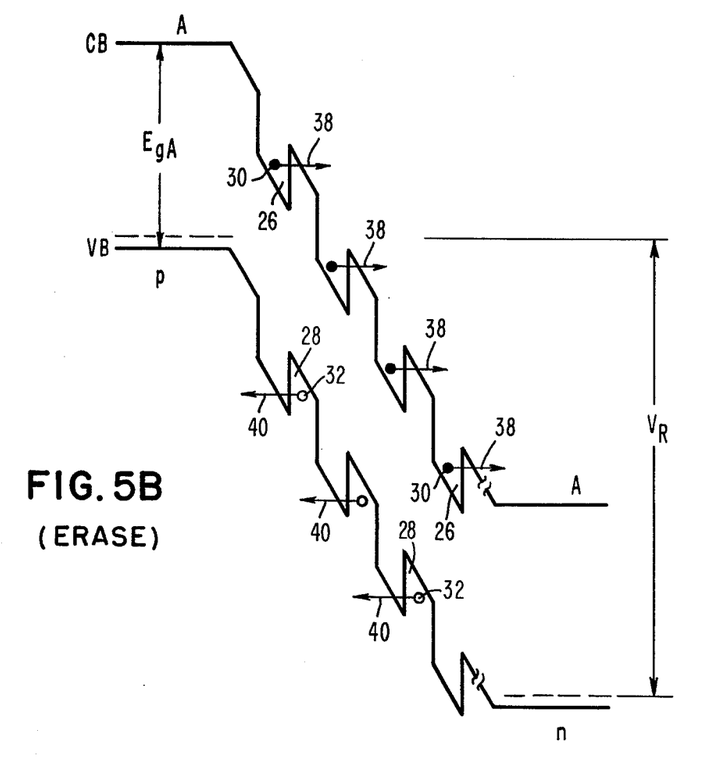
FIG. 5B illustrates the ERASE operation where confined electrons and holes in the potential wells of the storage device of FIG. 3 escape from these wells.

FIGS. 5A and 5B illustrate the write and erase operations for the present device. In FIG. 5A, a forward bias $V_F$ is applied to the p-n junction of FIG. 3, in order to inject holes and electrons into the potential wells in the space charge region. The same reference numerals will be used as were used in FIGS. 4A and 4B. Thus, under forward bias, electrons are injected from n-type layers 16 into the potential wells 26, as indicated by the arrows 34. Correspondingly, holes 32 are injected into the potential wells 28 from p-type layer 14, as indicated by arrows 36. This produces state 2 of the device. Of course, light source 24 can be used to create holes and electrons which relax into the potential wells. This state remains after the removal of the injection or excitation source for a period of time up to several seconds.

In FIG. 5B, a large reverse bias $V_R$ is applied across the p-n junction of the device of FIG. 3. This removes confined electrons 30 from the potential wells 26, as indicated by the arrows 38. At the same time, this reverse bias causes confined holes 32 to escape out of the potential wells 28, as indicated by the arrows 40.

The WRITE, READ and ERASE operations of the storage device of FIG. 3 will now be outlined.

WRITE

In order to write state 2 of the device, electrons and holes are generated in the device. As mentioned, this is done either by forward biasing the p-n junction formed between layers 14 and 16, or by providing incident light. If these charge carriers are injected using variable power source 20, the forward current which is used is relatively high in order to insure that as many potential wells as possible are filled by holes and electrons. For the semiconductor allows mentioned, a voltage of approximately IV is suitable. If light source 24 is used for generation of holes and electrons the photon energy is chosen to be sufficient to excite a sufficient amount of electrons and holes to fill as many as possible of these potential wells. For example, the photon energy would be at least as great as the larger of the energy band gaps $E_{gA}$ or $E_{gB}$.

READ

As mentioned, the conductance of the storage device and its capacitance depend on the number of holes and electrons confined in the potential wells in heterostructure 18. Thus, when the heterostructure does not have holes and electrons confined therein, its conductance will be different than when electrons and holes are confined therein. This change in conductance is indicated by measuring the current I when a small forward or reverse bias is applied by source 20 or by a.c. modulation means. The amount of bias is chosen to be sufficiently small that the state of the device is not changed while the state is being read. For the InGaAs-GaSbAs semiconductor alloys previously mentioned, an appropriate bias for the read operation is approximately in the mV range.

ERASE

In the erase operation, electrons and holes which are confined in the potential wells of heterostructure 18 are removed. A large reverse bias $V_R$ can be provided by source 20 to achieve this. This bias is preferably even larger than $V_F$ to insure that all holes and electrons are removed from confinement within the wells. For the semiconductor alloy system described, an appropriate reverse bias is $\geq 10$ volts.

Locating the heterostructure 18 in the space charge region of a p-n junction is a particularly favorable embodiment since it is basically a high resistivity storage device, and thus can detect relatively small incremental changes in conductance or capacitance.

Figure 6:
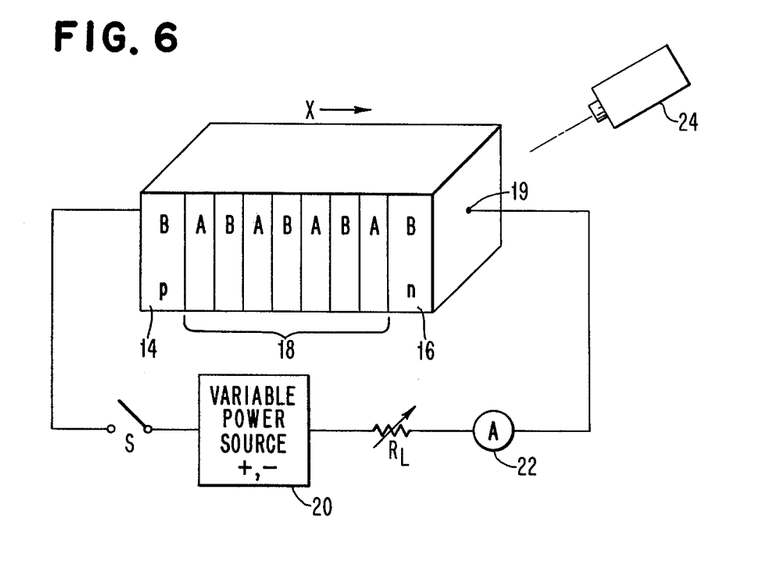
FIG. 6 is an illustration of a storage device which is similar to that of FIG. 3, except that the end semiconductor layers are not comprised of semiconductor material B.
Figure 7A:
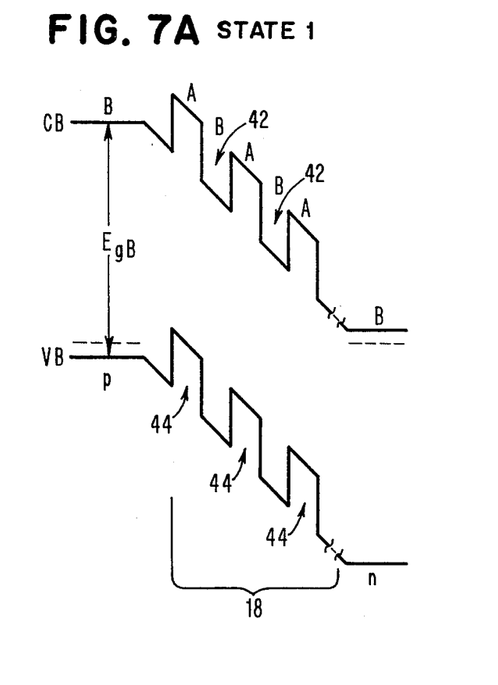
Figure 7B:
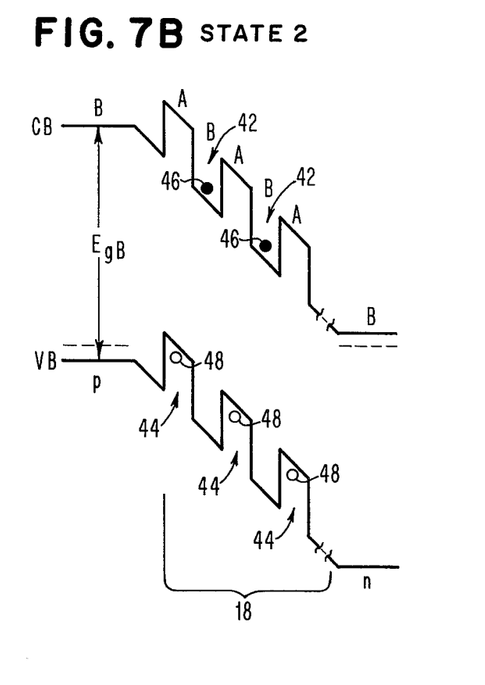

JUNCTION STORAGE DEVICE (FIGS. 6, 7A and 7B)

This storage device is similar to that of FIG. 3, except that semiconductor B is used for the end layers, rather than semiconductor A, as was used in the device of FIG. 3. Accordingly, the same reference numerals will be used to described this device. The operation of the device of FIG. 6, is the same as that of the device of FIG. 3.

Thus, heterostructure 18 is located between p-type region 14 and n-type region 16, both of which are comprised of semiconductor B. Ohmic contacts 19 are made to layers 14 and 16 and a series connection of switch S, variable power source 20, load resistor $R_L$, and current meter 22 is made to the device. Also, light source 24 is provided.

FIGS. 7A and 7B are used to show energy band diagrams for the device of FIG. 6, in an unbiased condition. This illustrates state 1 and state 2 of the storage device.

Because the layers 14 and 16 are comprised of semiconductor B, the directions of the potential wells in the energy band diagram are reversed from what they were in FIGS. 4A and 4B. In FIG. 7A, electrons are not confined in potential wells 42, and holes are not confined in potential wells 44. In FIG. 7B, electrons, indicated by darkened circles 46, are confined in potential wells 42. Correspondingly, holes, indicated by open circles 48, are confined in the potential wells 44.

The WRITE, READ and ERASE operations for the device of FIG. 6 are the same as those for the device of FIG. 3, and need not be repeated.

Figure 8:
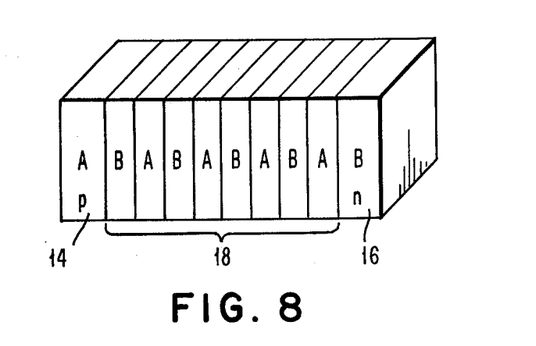
FIG. 8 is an illustraion of another storage device in accordance with the present invention, where the end semiconductor layers are comprised of different semiconductor materials A and B. The circuitry used for write, read and erase are not shown for ease of illustration.
Figure 9A:
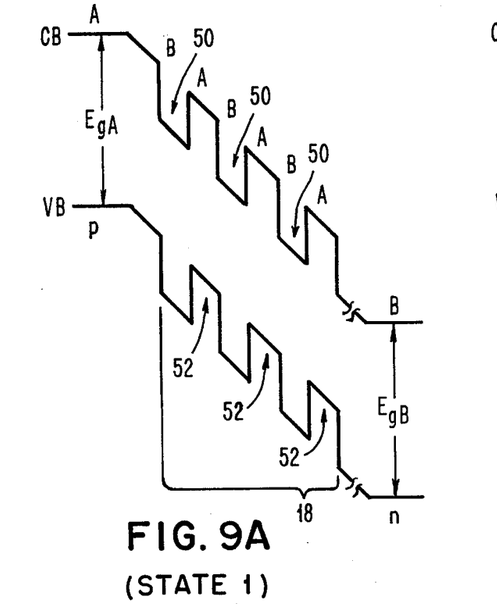
Figure 9B:
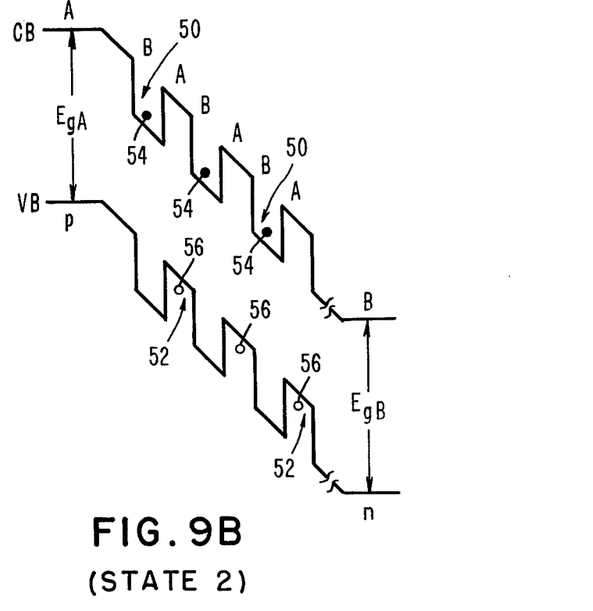

JUNCTION STORAGE DEVICE (FIGS. 8, 9A and 9B)

This junction storage device is similar to the devices of FIGS. 3 and 6, except that dissimilar semiconductor materials are used for the p-type layer and for the n-type layer. The same reference numerals will also be used to described this device. Accordingly, p-type layer 14 is comprised of semiconductor material A while n-type layer 16 is comprised of semiconductor B. Heterostructure 18 is located between layers 14 and 16. For ease of illustration, the associated circuitry used for the write, read and erase operations is not shown in this drawing. It should be understood, however, that the circuitry is identical to that shown in FIGS. 3 and 6.

FIGS. 9A and 9B illustrate energy band diagrams for the storage device of FIG. 8, in an unbiased state. Thus, in FIG. 9A, spatially separate electron and hole wells are provided by heterostructure 18 in the space charge region of the p-n junction formed by layers 14 and 16. Electron wells 50 are provided in the conduction band edge of semiconductor B, while hole potential wells 52 are provided in the valence band edge of semiconductor A.

FIG. 9B shows state 2 of the device in which electrons and holes are confined in the potential wells 50 and 52, respectively. The confined electrons are indicated by the darkened circles 54 while the confined holes are indicated by the open circles 56.

The WRITE, READ and ERASE operations for the device of FIG. 8 are the same as those for the devices of FIG. 3 and FIG. 6, and will therefore not be explained here.

STORAGE DEVICE ARRAY (FIGS. 10, 11A-11D)

These figures illustrate an array of storage devices in a wafer of semiconductor material, and further illustrate the energy band diagrams for the individual storage devices and for the material surrounding the individual devices. This type of structure can be used to provide three-dimensional potential wells for holes and electrons so as to more completely confine the movement of holes and electrons in order to minimize recombination. The degree to which holes and electrons are confined in dimensions other than that measured normal to the layers comprising the storage device depends upon the material surrounding the storage devices. This will be explained more completely with respect to the energy band diagrams of FIGS. 11A-11D.

Figure 10:
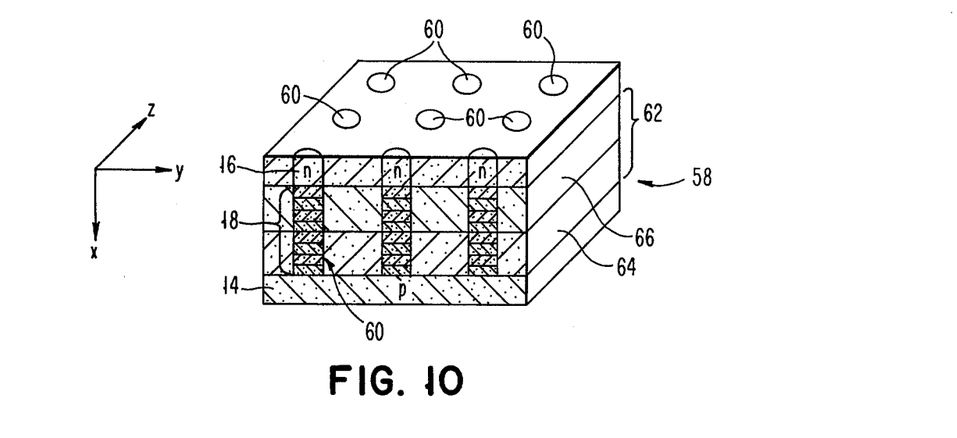
FIG. 10 is a wafer containing a plurality of the subject storage devices, illustrating the concept of 3-D confinement.

In more detail, wafer 58 is comprised of several heterostructure storage devices 60 which are surrounded by a material 62. As will be seen, material 62 can be different types of semiconductor material or can be an insulating material.

Each of the individual heterostructure storage devices 60 is the same as the devices described previously with respect to FIGS. 3, 6 and 8. Therefore, the same reference numerals will be used to describe the individual components of these storage devices. Thus, p-type end layer 14 and n-type end layer 16 have heterostructure 18 located therebetween.

The array of FIG. 10 is used to illustrate 3-dimensional electron and hole confinement, although it is not absolutely essential that both electrons and holes be confined in the illustrated embodiments. Thus, FIG. 10 illustrates various techniques for providing potential wells for confining electrons and holes along the directions $y$ and $z$. This provides more total confinement of electrons and holes to increase the lifetime of the memory state in which electrons and holes are generated in the heterostructure 18.

In FIG. 10, material 62 is often comprised of two semiconductor layers 64 and 66, which form a p-n junction with each other. For example, when end layer 14 is p-type, layer 64 can also be p-type while layer 66 will be n-type. The materials comprising layers 64 and 66 can be the same semiconductor material or different semiconductor materials. For example, they can both be semiconductor A or semiconductor B. Also, layer 64 can be semiconductor A while layer 66 is semiconductor B, and vice versa. For example, when p-type end layer 14 is semiconductor B, layer 64 can also be semiconductor B while layer 66 will be semiconductor A, as will be end layer 16. Of course, end layers 14 and 16 can both be comprised of the same semiconductor material (A or B), or of different materials (A and B). In addition to these variations, material 62 can be a semiconductor material C which has a wide band gap, as will be more fully described with reference to FIG. 11D.

FIGS. 11A-11D illustrate the energy band structures for the individual storage devices 60 and also for the confinement of electrons and holes in the layers 62 surrounding the individual storage devices.

Figure 11A:
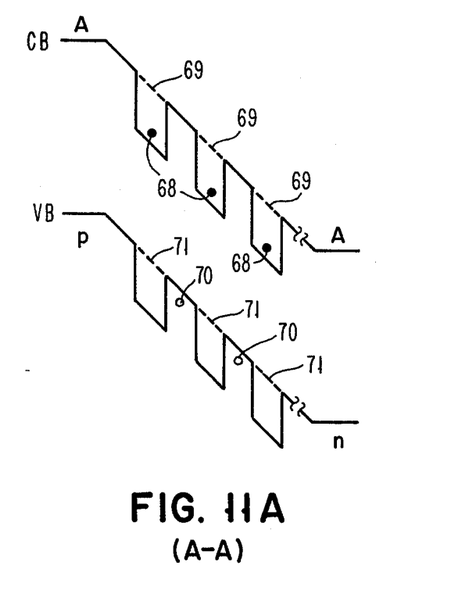
FIGS. 11A-11D illustrate energy band diagrams for the individual storage devices and for the materials surrounding the storage devices, for the wafer of FIG. 10, in accordance with the nature of the materials used around the storage devices.

In more detail, FIG. 11A shows the energy band diagram in solid lines for the individual storage device 60, and the energy band diagram, in dashed lines, for the surrounding material 62. In this case, material 62 is comprised of a p-type layer of semiconductor A while layer 64 is comprised of an n-type layer of semiconductor A. End layers 14 and 16 are also comprised of semiconductor material A. Thus, the energy band diagram for the storage device 60 in FIG. 11A is the same as that for the device of FIG. 3. Accordingly, confined electrons are indicated by the dark circles 68 while confined holes are indicated by the open circles 70.

As in apparent from FIG. 11A, the electrons 68 are prevented from moving in directions $y$ and $z$ by the potential barrier (dashed line) established by the p-n junction comprising layers 64 and 66. This is apparent since the dashed line 69 indicating the conduction band edge of the p-n junction between layers 64 and 66 closes the top of the electron potential wells. However, holes 70 are not confined in the $y$ and $z$ direction since they can move out of their potential wells. That is, the dashed line 71 representing the valence band edge of the p-n junction between layers 64 and 66 is at the bottom of the hole wells, rather than being at the top of these wells, in order to close them.

Figure 11B:
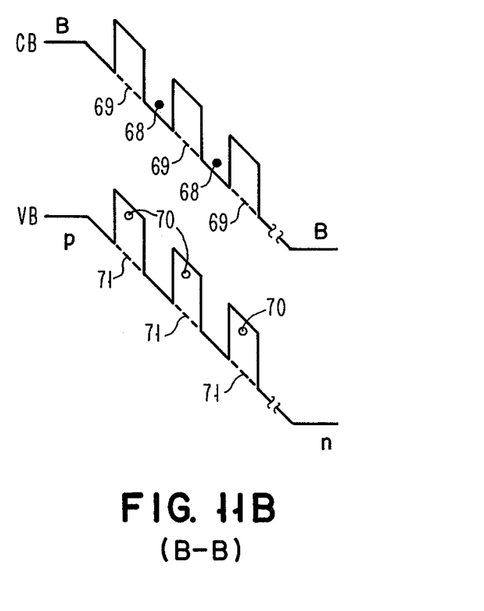

FIG. 11B shows the situation where layers 64 and 66 are both comprised of semiconductor B, layer 64 being of p-type and layer 66 being of n-type. Layers 14 and 16 are also of B semiconductor material. Again, confined electrons are indicated by the dark circles 68, while confined holes are indicated by the open circles 70.

With semiconductor layers 64 and 66 being of semiconductor B, the dashed valence band edge 71 corresponding to the valence band edge of the p-n junction formed between layers 64 and 66 is at the top of the hole wells. This means that a barrier is presented to prevent confined holes from moving in the $y$ and $z$ directions. However, the dashed line 69 representing the conduction band edge of the p-n junction formed between layers 64 and 66 does not enclose the top of the electron wells, so that electrons 68 are not prevented from moving in directions $y$ and $z$ when layers 64 and 66 are comprised of semiconductor B.

Figure 11C:
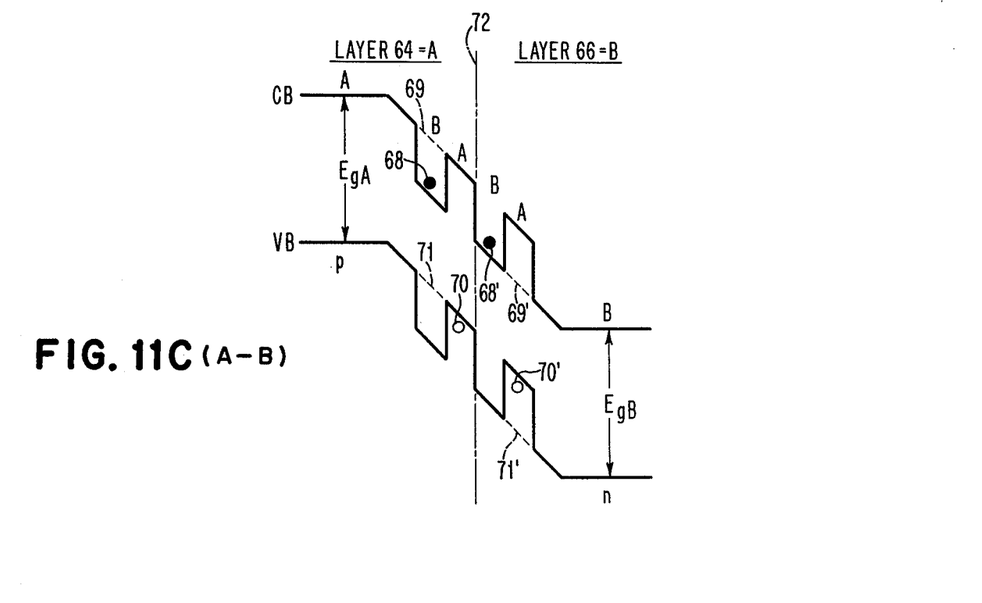

FIG. 11C illustrates the situation when layers 64 and 66 are of different semiconductor materials. For instance, layer 64 can be semiconductor A while layer 66 is semiconductor B. This means that electrons will be confined in directions y and z in layer 64, while holes will not be so confined, but that in layer 66 holes will be confined in directions y and z while electrons will not be so confined. The boundary junction between layers 64 and 66 is indicated by the dashed line 72.

in more detail, the solid line conduction band edge and solid line valence band edge lines in FIG. 11C are those for the storage device of FIG. 8. The dashed lines indicate the energy band diagram for the semiconductor layers 64 and 66. As is apparent, in layer 64, confined electrons 68 are prevented from leaving their wells in directions y and z by the barrier presented by the conduction band edge (dashed line 69) across the top of the confinement well. However, holes 70 in layer 64 are not prevented from leaving their confinement wells since the valence band edge (dashed line 71) of the p-n junction formed between layers 64 and 66 does not go across the top of the hole well but rather lies along the valence band edge of the storage device at the bottom of the well in which hole 70 is confined.

In contrast with this, electrons are not confined from moving in directions y and z in layer 66, while holes 70' are confined. Thus, on the right-hand side of dashed line 72, the valence band edge of the p-n junction formed between layers 64 and 66 is shown by the dashed line 71 which presents a barrier at the top of the hole well. This prevents hole 70' from moving in directions y and z. However, the conduction band edge 69' for the p-n junction between the layers 64 and 66 lies partly along the conduction band edge of the storage device 60 and does not close the top of the potential well for electron 68'. Therefore, it does not prevent electron 68' from leaving its potential well.

Figure 11D:
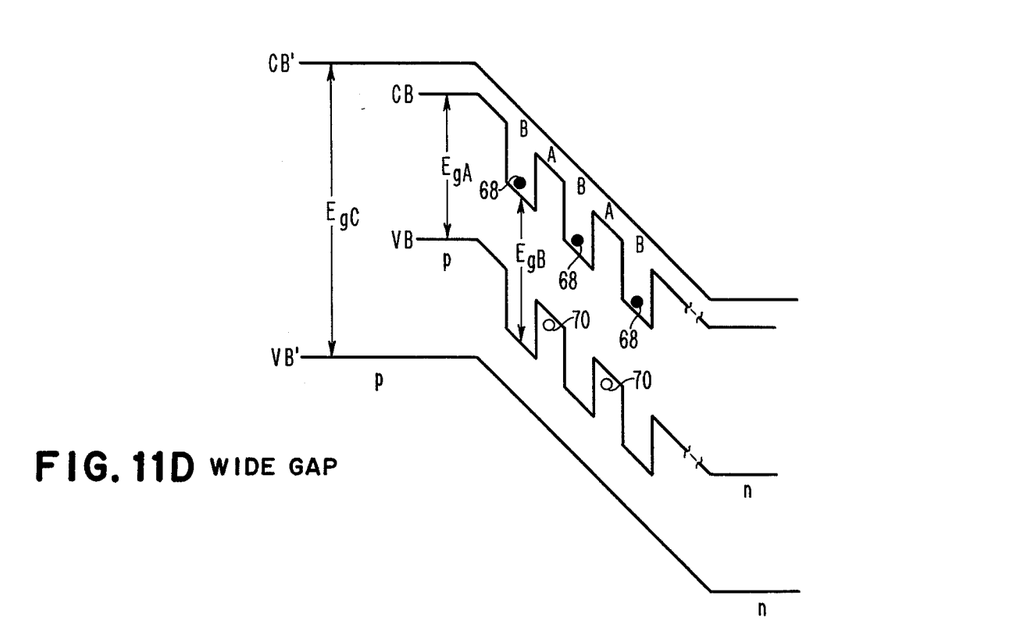

In FIG. 11D, the material 62 is entirely of one type, designated semiconductor C. This is chosen to be a wide gap material, such as GaAs. The energy band diagram for the storage device 60 is represented by the conduction band edge CB and valence band edge VB, which is a typical energy band diagram for one of the illustrated storage devices. The energy band diagram for the surrounding material C has a valence band edge VB' and a conduction band edge CB'. Its band gap $E_{gC}$ is greater than the band gaps $E_{gA}$ and $E_{gB}$ of the materials A and B which might be used for the individual storage devices. Because the band gap of material C is wide, both confined electrons 68 and holes 70 are prevented from moving out of their potential wells in all directions x, y, z.

FABRICATION (FIGS. 12A-12F)

Figure 12A:
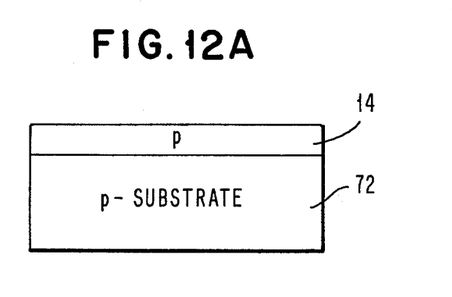
FIGS. 12A-12F illustrate one technique for producing the wafer of FIG. 10, using well known semiconductor fabrication steps.

These figures illustrate but one technique for producing the array of storage devices 58 in FIG. 10. In FIG. 12A, a p-type substrate 72 is provided on which is epitaxially grown a p-type layer 14. Layer 14 is the end layer 14 shown in FIG. 10, which is one portion of the junction storage device of the present invention. It is a layer used to smooth out the top of the substrate 72, and is given the designation 14 since it is a portion of the storage devices previously described. Components of the storage devices previously described are given the same reference numerals.

Figures 12B, 12E:
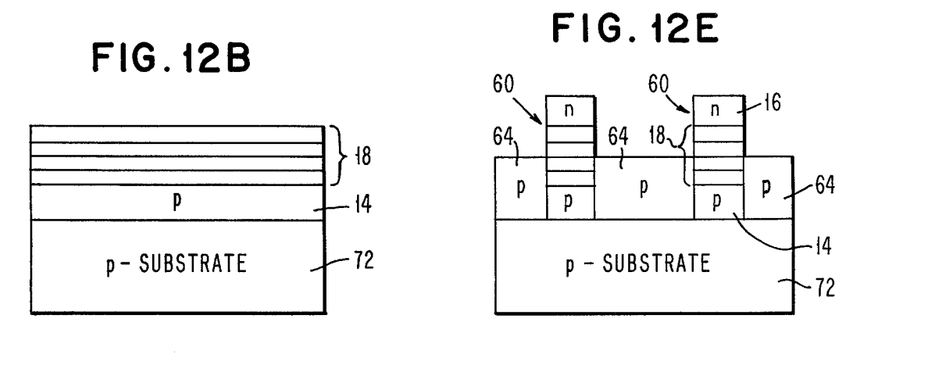

In FIG. 12B, the individual layers comprising the heterostructure 18 are grown by molecular beam epitaxy. This technique is particularly suitable since it will provide semiconductor layers having good smooth interfaces. Further, the semiconductor material typically used will provide good lattice matching which is a requisite for providing good interfaces between layers.

Figure 12C:
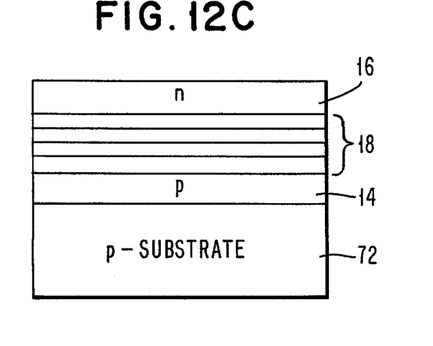

In FIG. 12C, an n-type semiconductor layer 16 is also deposited by molecular beam epitaxy. This is the n-type layer shown in FIGS. 3, 6 and 8. In one example, p-type material can be GaSbAs semiconductor alloy while the n-type material can be a semiconducting InGaAs alloy.

Figure 12D:
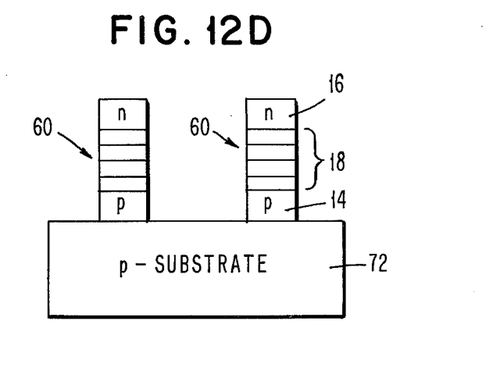

In FIG. 12D, portions of the structure have been masked to protect the storage devices, generally designated 60 here and in FIG. 10, while the remaining portions of the structure of FIG. 12C have been removed by chemical etching.

In FIG. 12E, the layer 64 of FIG. 10 is deposited by molecular beam epitaxy onto portions of substrate 72. This will be the same type of material used for p-type layers 14 and substrate 72.

Figure 12F:
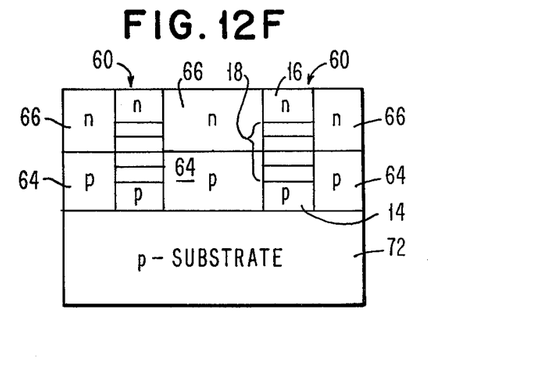

In FIG. 12F, a layer 66 (as shown in FIG. 10) is deposited by molecular beam epitaxy over layer 64. Layer 66 has the opposite conductivity type to layer 64, so that a p-n junction is formed between layers 64 and 66. Thus, the storage array 58 of FIG. 10 is provided by a series of epitaxial depositions and an etching step. Of course, it would be obvious to one of skill in the art that the layers 64 and 66 could first be deposited, then etched to form islands of these layers, after which the individual heterostructure devices 60 could be formed by molecular beam epitaxy in the regions between ethced layers 64 and 66.

OTHER EMBODIMENTS

In the practice of this invention, other embodiments can be described in accordance with the principles of the present invention for providing a storage device which has separated hole and electron wells. For instance, the end layers 14 and 16 can be absent so that the heterostructure 18 does not provide the sequence of hole and electron wells within the space charge of a p-n junction. In this embodiment, the same type of semiconductor materials can be used with the same thicknesses and doping levels as those mentioned.

In this embodiment, electrons and holes are generated (write) for confinement in the potential wells of the heterostructure using an incident light source in the manner described with respect to the embodiment of FIG. 3. In order to read the storage state of the device, lateral conductance parallel to the individual layers of the heterostructure 18 is measured, rather than conductance transverse to these layers as is the situation for the illustrated embodiments. Confined electrons or holes enhance lateral (sheet) conductivity due to the electrical neutrality condition and therefore the conductance of the device will indicate its storage state. Erasure is achieved by shining light onto the heterostructure in order to remove confined electrons and holes from the potential wells although this type of erasure is not as efficient as that using reverse bias explained with reference to FIGS. 3, 6 and 8. The incident light hs energies at least equal to $E_{gA}$ or $E_{gB}$, as explained previously.

Another embodiment uses the concepts of the previously described devices except that the periodic heterostructure 18 is comprised of alternating, ultra-thin layers of two semiconuctors. Examples of such semiconductors are the InGaAs and GaSbAs alloys mentioned previously. The thicknesses of the individual layers A and B is typically 10-100 A in this embodiment and the doping of the individual layers is approximately $10^{16}$–$10^{17}$ cm$^{-3}$. Superlattices of semiconducting materials have been described in the literature, as can be seen by referring to:

1. L. L. Chang et al, "The Growth of GaAs-GaAlAs Superlattice," J. Vac. Sci. Technol., Volume 10, No. 1, January/February 1973, p. 11.
2. L. L. Chang et al, "Structures Grown by Molecular Beam Epitaxy," J. Vac. Sci. Technol. Volume 10, No. 5, September/October 1973, p. 655.
3. L. Esaki et al, "Semiconductor Superfine Structures by Computer-Controlled Molecular Beam Epitaxy," Thin Solid Films, 36 (1976), pp. 285-298.
4. G. A. Sai-Halasz et al, Applied Physics Letters, 30, June 15, 1977, p. 651.
5. U.S. Pat. No. 3,626,257

In the superlattice embodiment, operation is similar to that of the previously described embodiments. However, because a superlattice is used, the energy states in the device are quantized. The conduction band ground state and the valence band ground state are highly localized while the excited conduction band states and the excited valence band states are relatively free because of their high energy positions.

To write electrons and holes into potential wells in the superlattice, light energy is applied having a frequency such that the energy of the light will be equal to the energy band difference between the excited conduction band states and the excited valence band states. This will create electrons and holes which will relax to positions in the ground state potential wells. In order to read the superlattice device, lateral conductivity is measured as has been described previously. Erasure is accomplished by shining light onto the device a process reverse to the writing process. Confined electrons and holes are moved to the excited states in the conduction band and valence band, respectively, where they are free to recombine.

It is, of course, possible to locate the superlattice in the space-charge region of a p-n homo- or heterojunction as are the main embodiments described previously. The high built-in electric field in the space-charge region, however, destroys the coherency of the superlattice. This embodiment, consequently, described just one particular case of the main embodiment with an extremely thin alternating layered structure.

Another embodiment, termed the p-n-p-n-p . . . storage device, differs from the previously described embodiments in that it is comprised of alternating layers having opposite conductivity type. Thus, a series of p-n junctions is provided. A periodic arrangement of potential wells is provided by the series of p-n junctions, rather than by a heterostructure, as was the case for the previous embodiments. For example, impurity profile doping can be used to provide alternating p-type and n-type layers in either Si or Ge. If desired, alternating layers of opposite conductivity type of these materials can be provided by molecular beam epitaxy. The thickness of the individual layers is generally of the order of a few hundred Angstroms, such as 500 Angstroms, and the doping of each layer can be approximately $10^{16}$–$10^{17}$ cm$^{-3}$. The thickness and doping of the individual layers is typically set so that the entire structure is depleted of charge carriers in one state.

When two end layers of the device of opposite conductivity type are provided, a space charge region will be formed and storage device operation is the same as that for the device of FIG. 3. Without end layers, the operation of the device is the same as that for a heterostructure not located in the space charge region of an p-n junction.

In the operation of any of the storage devices which have been illustrated, as with conventional semiconductor memories, continued application of light or electrical pulses will be used to sustain the state where charge carriers are confined in potential wells. Thus, control circuits would be utilized to continually refresh the state of the storage device if it is desired to have that state be the one where charge carriers are confined. This type of operation is well known in the semiconductor memory art and will not be explained further. Also, in the practice of this invention on a practical basis, arrays of storage devices such as those described can be fabricated by modern lithographic techniques.

The amplitudes and widths of the various electrical and light pulses applied are easily determined by designers in accordance with the principles of this invention. Thus, the amplitude and width of electrical and light pulses used to generate carriers within the storage devices is determined with respect to the number of layers in the device, the conductivity of the layers, and the type of materials comprising the layers.

The various semiconductor materials used to provide these devices are chosen in accordance with the energy band diagram which is required, and the ease with which the device can be made using standard lithographic techniques. Heterostructures are extremely convenient for use, since they can be chosen to provide the proper band configuration and lattice matching. This is a prerequisite for elimination of interface states which would impair carrier lifetimes. The use of semiconductor alloys, such as those mentioned, is particularly suitable since the compositions can be changed to provide the desired band structure and to provide close lattice matching. In addition to the alloys mentioned, alternating layers of Si and GaP will provide the energy band diagram of FIG. 1A.

The use of molecular beam epitaxy is particularly advantageous for providing heterostructures of varying layer thicknesses. The aforementioned prior art references describe this type of epitaxy. For example, an MBE system can be used to produce $In_{1-x}Ga_xAs$-$GaSb_{1-y}As_y$ layered structures in accordance with the principles and apparatus described in reference 2, with the addition of four effusion cells containing elemental In, Ga, Sb, and As. Films of these semiconductor alloys can be grown at rates of approximately 1-3 Angstroms per second on (100) surfaces of GaSb, InAs, and GaAs, which are maintained between 450° and 600° C. Ohmic contacts to $In_{1-x}Ga_xAs$ semiconductor alloys can be made by alloying Au-Ge to this semiconductor, while Au-Sn can be alloyed to $GaSb_{1-y}As_y$ semiconductor alloys to make ohmic contacts thereto.

What has been described is a new semiconductor storage or memory device in which the states of the device exist without the need for retention voltages or power. A layered structure (preferably periodic) is used to provide electron and hole potential wells which are spatially displaced from one another. Three-dimensional potential wells can be provided by surrounding the heterostructures by a junction environment as shown in FIG. 10.

Thus, the storage devices of this invention provide means for producing spatially separate electron and hole wells, means for providing electrons and holes in these wells, means for detecting the presence and absence of these electrons and holes in the potential wells, and means for removing confined electrons and holes from these wells. While light and electrical pulses are conveniently shown for the writing operation and conductance changes are conveniently used for discrimination of states, it is envisioned that people of skill in the art can devise alternate techniques for either the write, read or erase operation in accordance with the principles of the present invention. Further, variations in the types of layered structures can probably be envisioned based on the principles of this invention. The example shown are merely illustrative embodiments describing the semiconductor means for providing spatially displaced electron and hole wells, and the means for writing, reading and erasing information states within the device.

What is claimed is:

1. A semiconductor storage device, comprising: semiconductor means for producing spatially separated potential wells for electrons and holes, write means for generating electrons and holes in said wells, and read means for detecting the presence of said electrons and holes in said wells.

2. The device of claim 1, where said semiconductor means is a heterostructure comprising alternating layers of different semiconductor materials.

3. The device of claim 2, where said heterostructure is located in the space charge region of a p-n junction.

4. The device of claim 3, where said p-n junction is a homojunction.

5. The device of claim 3, where said p-n junction is a heterojunction.

6. The device of claim 2, where said heterostructure is comprised of a superlattice of very thin, alternating layers of two different semiconductors.

7. The device of claim 2, where said heterostructure is comprised of alternating layers of opposite conductivity type.

8. The device of claim 5, where said alternating layers of opposite conductivity type are located in the space charge region of a p-n junction.

9. The device of claim 1, where said write means is an electrical energy source connected to said device.

10. The device of claim 1, where said write means is a light source for producing light incident upon said device.

11. The device of claim 1, where said read means includes means for measuring the conductance of said storage device.

12. The device of claim 1, where said read means includes means for measuring the capacitance of said device.

13. The device of claim 1, including other said storage devices, where all of said storage devices are located in an array of such devices, there being a p-n junction between adjacent said devices.

14. The device of claim 1, where said heterostructure has an energy band diagram having conduction band edge discontinuities and walence band edge discontinuities which extend in the same direction in said energy diagram.

15. The device of claim 1, where said storae device is surrounded by a semiconductor material having a wider energy gap than the energy gap of said semiconductor means.

16. The device of claim 1, where alternating layers of said heterostructure are comprised of alloys of InGaAs and GaSbAs.

17. A semiconductor memory device, comprising: semiconductor layers of opposite conductivity type defining a p-n junction, a plurality of layers of semiconductor materials located in the space charge region of said p-n junction, said semiconductor layers having an energy band diagram which is a sequence of conduction band edge discontinuities and valence band edge discontinuities which are in the same direction in said energy diagram, said discontinuities forming potential wells for confinement of electrons and holes, means for producing electrons and holes for confinement in said potential wells in said semiconductor layers, means for detecting the presence of electrons and holes in said potential wells.

18. The device of claim 17, where the potential wells for electrons are spatially separated from the potential wells for holes.

19. The device of claim 18, where said plurality of layers is comprised of alternating layers of two different semiconductor materials.

20. The device of claim 19, where the semiconductor layers defining said p-n junction are comprised of the same semiconductor material.

21. The device of claim 19, where the semiconductor layers defining said p-n junction are comprised of different semiconductor materials.

22. The device of claim 19, where said means for producing electrons and holes is an electrical means for forward biasing said p-n junction.

23. The device of claim 19, where said means for producing electrons and holes in said device includes a light source.

24. The device of claim 17, including erase means for removing electrons and holes from said potential wells.

25. The device of claim 24, where said erase means is an electrical source for reverse biasing said p-n junction.

26. The device of claim 18, where said means for detecting includes means for measuring the conductance of said device.

27. The device of claim 18, where said means for detecting includes means for measuring the capacitance of said device.

28. A semiconductor storage device, comprising: a heterostructure comprising alternating layers of different semiconductor materials, said heterostructure having an energy band diagram exhibiting conduction band edge discontinuities and valence band edge discontinuities which are in the same direction in said energy diagram, said alternating layers providing spatially displaced electron wells and hole wells, means for producing electrons and holes said electron and hole wells. means for detecting the presence and absence of electrons and holes in said wells, means for removing electrons and holes confined in said wells.

29. The device of claim 28, where said alternating layers are epitaxial layers having close lattice matching.

30. The device of claim 29, where said alternating semiconductor layers are closely lattice matched.

31. The device of claim 30, where said semiconductor materials are semiconductor alloys.

32. The device of claim 30, where said semiconductor material are comprised of Si and GaP.

33. The device of claim 30, further including semiconductor means surrounding said device for further confinement of electrons and holes in said device.

34. The device of claim 33, where said surrounding semiconductor material is a wide band gap material.

35. The device of claim 33, where said surrounding semiconductor material forms a p-n junction.

36. The device of claim 31, where one of said semiconductor alloys is an alloy of InGaAs and said other semiconductor material is an alloy of GaSbAs.

37. A semiconductor storage device, comprising:
a periodic semiconductor structure comprising alternating layers of different semiconductor materials having substantially the same thickness, said periodic structure having an energy band diagram which is a periodic series of conduction band edge and valence band edge discontinuities which are in the same direction in said energy diagram,
means for producing electrons and holes which are confined by said discontinuities,
means for detecting the presence of said confined electrons and holes, and
means for removing electrons and holes from confinement by said discontinuities.

38. The device of claim 37, where said periodic structure is comprised of epitaxial layers closely lattice matched to one another.

39. The device of claim 38, where said epitaxial layers are comprised of semiconductor alloys.

40. The device of claim 38, where said periodic structure is located in the space charge region of a p-n junction.

41. The device of claim 38, where said periodic structure is a superlattice.

42. A semiconductor storage device, comprising:
a periodic structure comprised of a series of p-n junctions, the energy diagram of such structure being a series of potential wells for electrons and holes, said wells for electrons being spatially separated from said wells for holes,
means for producing electrons and holes in said separated wells,
means for detecting the presence or absence of electrons and holes in said wells, and
means for removing electrons and holes from said wells.

43. The device of claim 42, where said semiconductor is selected from the group consisting of silicon and germanium.

44. A semiconductor storage device, comprising:
a heterostructure comprised of alternating layers of different semiconductor materials, the conduction band edge of said heterostructure providing potential wells for confinement of electrons and the valence band edge structure providing potential wells for confinement of holes, where said electron potential wells are spatially separated from said hole potential wells along a first direction perpendicular to the plane of the layers comprising said heterostructure,
means for producing electrons and holes for confinement in said electron and hole wells, and
means for detecting the presence or absence of electrons and holes in said potential wells.

45. The device of claim 44, further including means for removing electrons and holes from confinement in said wells.

46. The device of claim 45, including means for confining said electrons and holes in directions perpendicular to said first direction.

47. The device of claim 44, where said heterostructure is comprised of layers of semiconductor materials having equal thickness.

48. The device of claim 44, where said heterostructure is located in the space charge region of a p-n junction.

49. The device of claim 44, where said heterostructure is comprised of epitaxial layers of semiconductor materials where said epitaxial layers are closely lattice matched to one another.

50. The device of claim 44, where said semiconductor materials are semiconductor alloys.

* * * * *

UNITED STATES PATENT AND TRADEMARK OFFICE
CERTIFICATE OF CORRECTION

PATENT NO. : 4,103,312
DATED : July 25, 1978
INVENTOR(S) : L. L. CHANG, L. ESAKI AND G. A. SAI-HALASZ It is certified that error appears in the above-identified patent and that said Letters Patent are hereby corrected as shown below:

Column 4, line 63, "illiseconds" should read --milliseconds--.

Column 6, line 4, "for" (second occurrence) should read --from--.

Column 6, line 45, before "semiconductor" insert --while--.

Column 7, line 13, "nother" should read --another--.

Column 12, line 60, change "hs" to --has--.

Column 15, line 62, "walence" should read --valence--.

Column 15, line 65, "storae" should read --storage--.

Column 16, line 59, after "holes" insert --in--.

Signed and Sealed this

Sixth Day of February 1979

[SEAL]

Attest:

RUTH C. MASON
Attesting Officer

DONALD W. BANNER
Commissioner of Patents and Trademarks